(12) United States Patent
Wu

(10) Patent No.: US 6,368,926 B1
(45) Date of Patent: Apr. 9, 2002

(54) METHOD OF FORMING A SEMICONDUCTOR DEVICE WITH SOURCE/DRAIN REGIONS HAVING A DEEP VERTICAL JUNCTION

(75) Inventor: David Donggang Wu, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/523,632

(22) Filed: Mar. 13, 2000

(51) Int. Cl.⁷ ............................................. H01L 21/336
(52) U.S. Cl. ...................... 438/300; 438/301; 438/303; 438/305; 438/306; 438/307; 438/586; 438/595
(58) Field of Search .................................. 438/300–301, 438/303, 305, 306, 307, 586, 595

(56) References Cited

U.S. PATENT DOCUMENTS

| 4,838,993 A | 6/1989 | Aoki et al. ................... 156/643 |
| 5,908,313 A | 6/1999 | Chau et al. ................... 438/299 |
| 6,162,691 A * | 12/2000 | Huang ......................... 438/300 |
| 6,303,448 B1 * | 10/2001 | Chang et al. ................. 438/300 |

FOREIGN PATENT DOCUMENTS

| WO | WO 98/13865 | 4/1998 | ........ H01L/21/8238 |

* cited by examiner

Primary Examiner—John F. Niebling
Assistant Examiner—Lynne Gurley
(74) Attorney, Agent, or Firm—Williams, Morgan & Amerson, P.C.

(57) ABSTRACT

The present invention is directed to a method of forming source/drain regions in a semiconductor device. In one illustrative embodiment, the method comprises forming a gate stack above a semiconducting substrate, forming a recess in said substrate proximate said gate stack, and performing an implantation process to implant dopant atoms into the bottom surface of the recess. The method further comprises forming a layer of epitaxial silicon in the recess, performing a second ion implantation process to form a doped region in at least the epitaxial silicon in the recess, and performing an anneal process to activate the implanted dopant atoms.

30 Claims, 5 Drawing Sheets

METHOD OF FORMING A SEMICONDUCTOR DEVICE WITH SOURCE/DRAIN REGIONS HAVING A DEEP VERTICAL JUNCTION

BACKGROUND OF THE INVENTION

1. Field of the Invention

The present invention is generally directed to the field of semiconductor processing, and, more particularly, to a method of forming source/drain regions in a semiconductor device.

2. Description of the Related Art

There is a constant drive within the semiconductor industry to increase overall performance and operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the transistor, the faster the transistor will operate. Thus, there is a constant drive to reduce the size, or scale, of the components of a typical transistor to increase device performance and the overall speed of the transistor, as well as integrated circuit devices incorporating such transistors.

With this continual drive to increase transistor performance, all aspects of device operation must be examined for purposes of enhancing device performance. For example, leakage currents that may occur whenever a semiconductor device, e.g., a transistor, is "on" or "off," must be reduced. One factor that tends to increase these leakage currents is having source/drain junctions of an insufficient depth. Typically, a contact comprised of a metal silicide, e.g., cobalt silicide, is formed above a source/drain region to facilitate the electrical connection of a conductive line to the source/drain region, i.e., the metal silicide region is used to reduce the contact resistance. If the depth of the junction, which is generally understood to be at a point at which the concentration of N-dopant atoms and P-type dopant atoms are approximately equal, is not deep enough, then there may be leakage currents when the device is either "on" or "off." Thus, in general, it is desirable to form source/drain regions in which the junction depth is deeper rather than shallower.

In general, source/drain regions may be formed by a variety of techniques. For example, source/drain regions may be formed by performing multiple ion implantation processes in which various dopant atoms are implanted into a semiconducting substrate. An initial ion implantation process may be performed to form relatively shallow, extension implants in the substrate. Thereafter, after sidewall spacers are formed adjacent the gate stack, a traditional source/drain implant may be performed at a relatively heavy dopant concentration, but much deeper than the initial extension implants. Next, another implant process, typically referred to as a co-implant process, may be performed in an effort to achieve greater junction depths. However, the lateral diffusion of these deeper junctions prevent the depth of the junction from going deeper than approximately 1500 Å using traditional process flows.

Another problem associated with source/drain regions is capacitance. In general, it is desirable to reduce the capacitance caused by the source/drain regions to enhance device performance. This capacitance must be charged and discharged every operating cycle in which the transistor the transistor is turned "on" or "off." This results in RC time delays with respect to signal propagation throughout the device, as well as an increase in the power consumed by the device during operation. In general, it would be desirable to have source/drain regions with a more gradual dopant concentration profile to reduce the capacitance of the source/drain regions.

The present invention is directed to a method that solves or at least reduces some or all of the aforementioned problems.

SUMMARY OF THE INVENTION

The present invention is directed to a method of forming source/drain regions in a semiconductor device. In one illustrative embodiment, the method comprises forming a gate stack above a semiconducting substrate, forming a recess in the substrate adjacent the gate stack, the recess having a bottom surface, and performing a first ion implantation process into the bottom surface of the recess to form a first doped region. The method further comprises forming a layer of epitaxial silicon in said recess, performing a second ion implantation process to form a second doped region in at least a portion of the epitaxial silicon layer in the recess, and annealing the first and second doped regions.

BRIEF DESCRIPTION OF THE DRAWINGS

The invention may be understood by reference to the following description taken in conjunction with the accompanying drawings, in which like reference numerals identify like elements, and in which.

Figure 1:
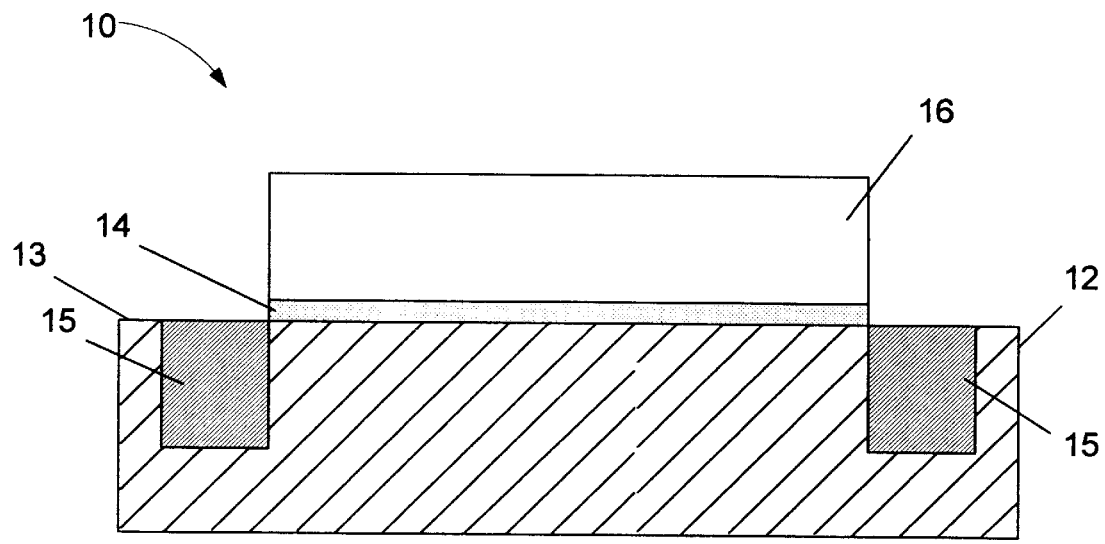
FIG. 1 is a cross-sectional view of a partially formed semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–9. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to the process of forming source/drain regions in a semiconductor device. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

A partially formed semiconductor device 10 is depicted in FIG. 1. Initially, shallow trench isolations 15 comprised of, for example, silicon dioxide, are formed in a semiconducting substrate 12. The semiconductor device 10 is comprised of a gate dielectric layer 14 formed above a surface 13 of the semiconducting substrate 12, and a gate electrode layer 16 formed above the gate dielectric layer 14. The semiconducting substrate 12 may be comprised of a variety of materials, such as silicon with a layer of epitaxial silicon (not shown) formed thereabove.

The materials comprising the gate dielectric layer 14 and the gate electrode layer 16 may be varied as a matter of design choice. For example, the gate dielectric layer 14 may be comprised of silicon dioxide, and the gate electrode layer 16 may be comprised of polycrystalline silicon (polysilicon). Moreover, these layers may be formed by a variety of known techniques for forming such layers, such as thermal growth, chemical vapor deposition ("CVD"), physical vapor deposition ("PVD"), plasma enhanced chemical vapor deposition ("PECVD"), sputtering, etc. Thus, the particular materials of construction, as well as the manner of making the gate dielectric layer 14 and the gate electrode layer 16, should not be considered a limitation of the present invention unless specifically recited in the appended claims. In one illustrative embodiment, the gate dielectric layer 14 is comprised of a thermally grown layer of silicon dioxide having a thickness ranging from approximately 15–30 Å, and the gate electrode layer 16 is comprised of approximately 1000–3000 Å of polysilicon that is formed by a deposition process.

Figure 2:
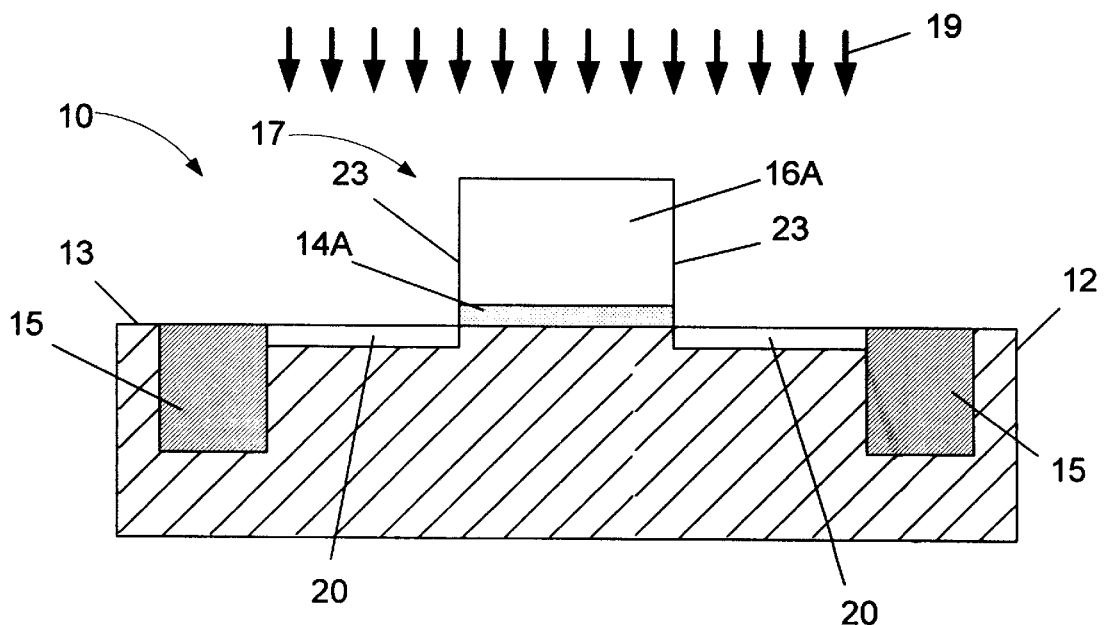
FIG. 2 is the device of FIG. 1 after a patterning operation has been performed to defined a gate stack above a semiconducting substrate.

Next, as shown in FIG. 2, the gate electrode layer 16 and gate dielectric layer 14 are patterned to define a gate stack 17 comprised of a gate electrode 16A and a gate dielectric 14A. This patterning may be accomplished by performing one or more etching processes, such as an anisotropic reactive ion etching process. Note, however, that it is not required that both the gate dielectric layer 14 and the gate electrode layer 16 be patterned at the same time. That is, the gate stack 17 may be comprised of only the patterned gate electrode layer 16 for all or a substantial portion of the processing operations described herein.

Thereafter, as indicated by arrows 19, an ion implantation process is performed to form self-aligned doped regions 20 in the substrate 12 for the illustrative NMOS device. The doped regions 20 may have a thickness ranging from approximately 200–1000 Å. The dopant atoms to be added by the implantation process 19 may vary depending upon the particular device under construction. For example, in the case of the illustrative NMOS device depicted in FIG. 2, the dopant atoms may be comprised of arsenic or phosphorous. For PMOS devices, the dopant materials may be comprised of boron, etc. In one illustrative implantation process for an NMOS device, the ion implantation process 19 is comprised of approximately $0.1–1.0 \times 10^{15}$ ions/cm$^2$ phosphorous implanted at an energy ranging between approximately 1–10 keV.

Figure 3:
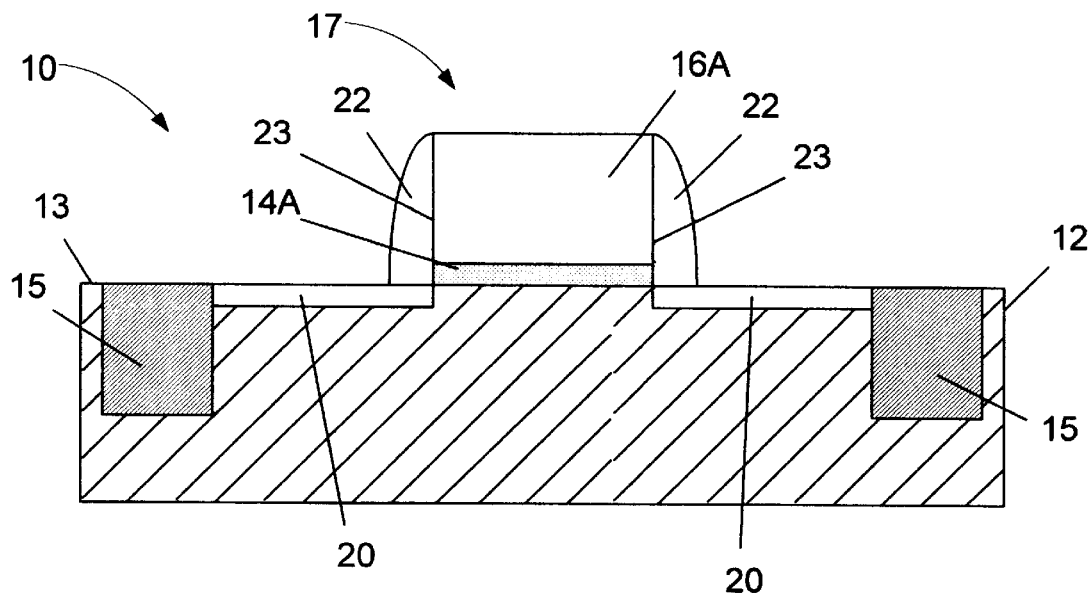
FIG. 3 is a cross-sectional view of the device shown in FIG. 2 after sidewall spacers have been formed adjacent the gate stack.

Next, as shown in FIG. 3, a plurality of sidewall spacers 22 are formed adjacent sides 23 of the gate stack 17. The sidewall spacers 22 may be constructed by forming an appropriate layer of spacer material, e.g., silicon dioxide, silicon oxynitride, etc., above the device depicted in FIG. 3, and, thereafter, performing an anisotropic etching process to result in the sidewall spacers 22. Please note that, although single sidewall spacers 22 are depicted in FIG. 3, multiple sidewall spacers could be formed adjacent each of the sides 23 of the gate stack 17.

Figure 4:
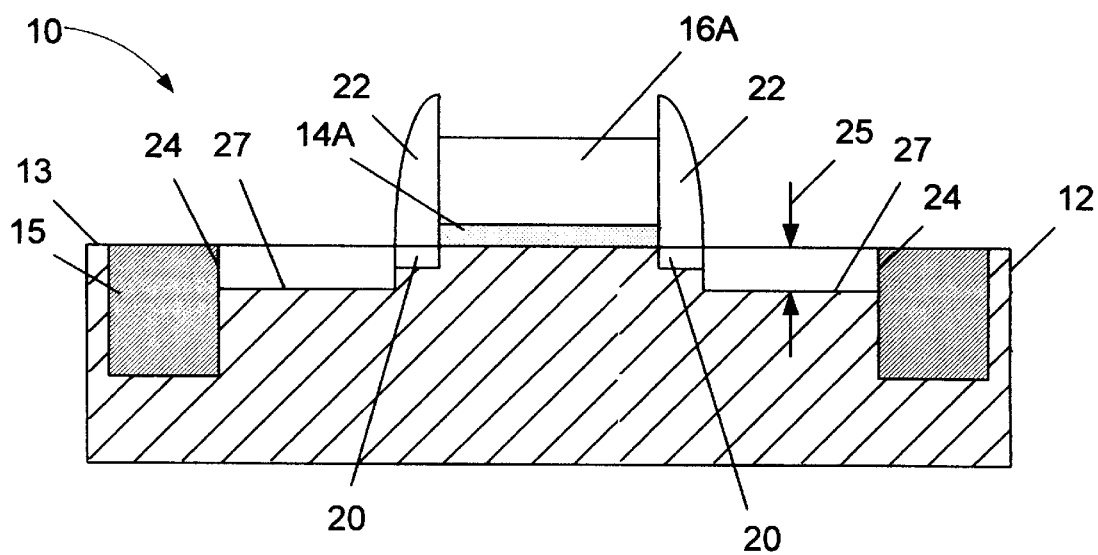
FIG. 4 is a cross-sectional view of the device shown in FIG. 3 after a recess has been formed in the substrate adjacent the sidewall spacers.

Next, as shown in FIG. 4, a plurality of recesses 24 having a bottom surface 27 at a preselected depth 25 awe formed in the substrate 12 adjacent or proximate the gate stack 17. In the illustrative embodiment depicted in FIG. 4, the recesses 24 are formed outside of the sidewall spacers 22. Of course, in situations where multiple sidewall spacers are formed adjacent each side 23 of the gate stack 17, the recesses 24 may be formed outside of the outermost sidewall spacer. The recesses 24 may be formed by a variety of techniques. For example, the recesses 24 may be formed by performing an anisotropic reactive ion etching process. During this process, portions of the gate electrode 16A may also be removed, as depicted in FIG. 4. The depth 25 of the recesses 24 may be varied as a matter of design choice. In one illustrative embodiment the depth 25 of the recesses 24 ranges from approximately 500–1500 Å. Note that, during the process of forming the recesses 24, some or all of the doped region 20 lying beyond the sidewall spacers 22 may be removed.

Figure 5:
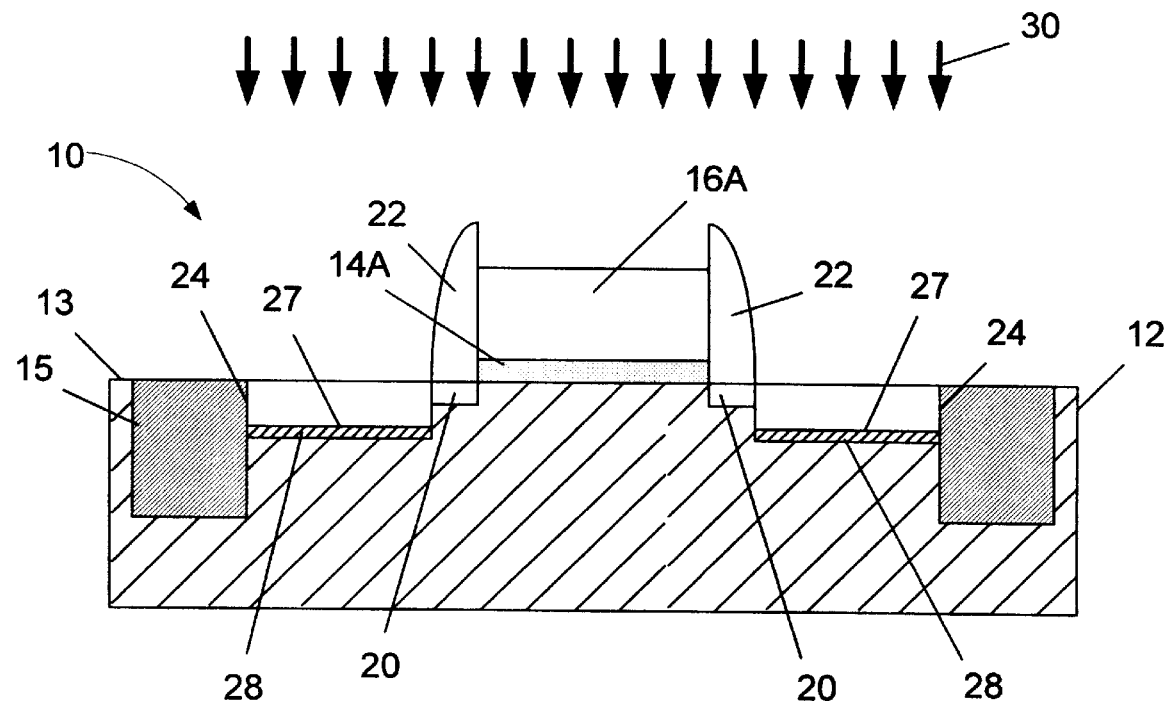
FIG. 5 is a cross-sectional view of the device shown in FIG. 4 after an ion implantation process has been performed to form a doped region in the area defined by the recess.

Thereafter, as shown in FIG. 5, an implantation process 30 is performed to implant dopant atoms into the bottom surface 27 of the recess 24, thereby forming doped regions 28 in the area defined by the recesses 24. The doped regions 28 may have a thickness ranging from approximately 200–800 Å. The particular dopant atoms selected as well as the concentration of the atoms may be varied as a matter of design choice, depending upon the particular technology involved. For example, in the case of an illustrative NMOS device, the ion implantation process 30 may be comprised of implanting approximately $0.2$–$2.0\times10^{14}$ ions/cm$^2$ of phosphorous at an energy level ranging from approximately 5–15 keV.

Figure 6:
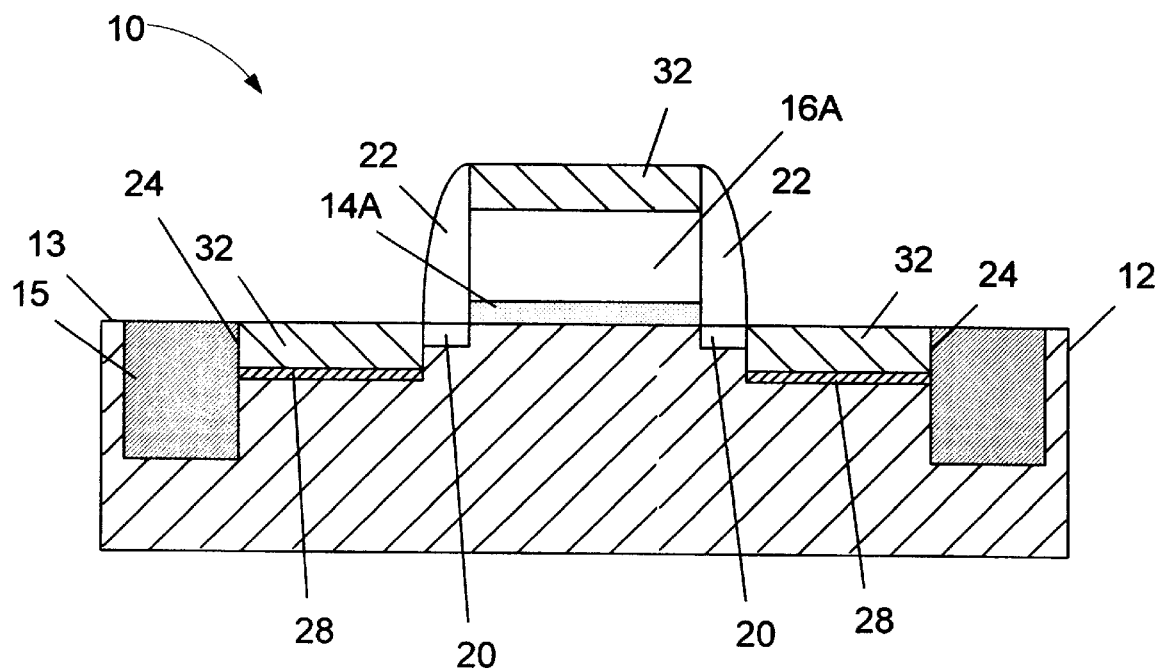
FIG. 6 is a cross-sectional view of the device shown in FIG. 5 after a plurality of epitaxial silicon regions have been formed above the device.

As shown in FIG. 6, epitaxial silicon regions 32 are then formed in the recesses 24 in the substrate 12 and above the gate electrode 16A. The epitaxial silicon regions 32 may be selectively formed so that the epitaxial silicon does not form on the sidewall spacers 22 comprised of, for example, silicon dioxide. The thickness of the epitaxial regions 32 may correspond approximately to the depth 25 of the recesses 24.

Figure 7:
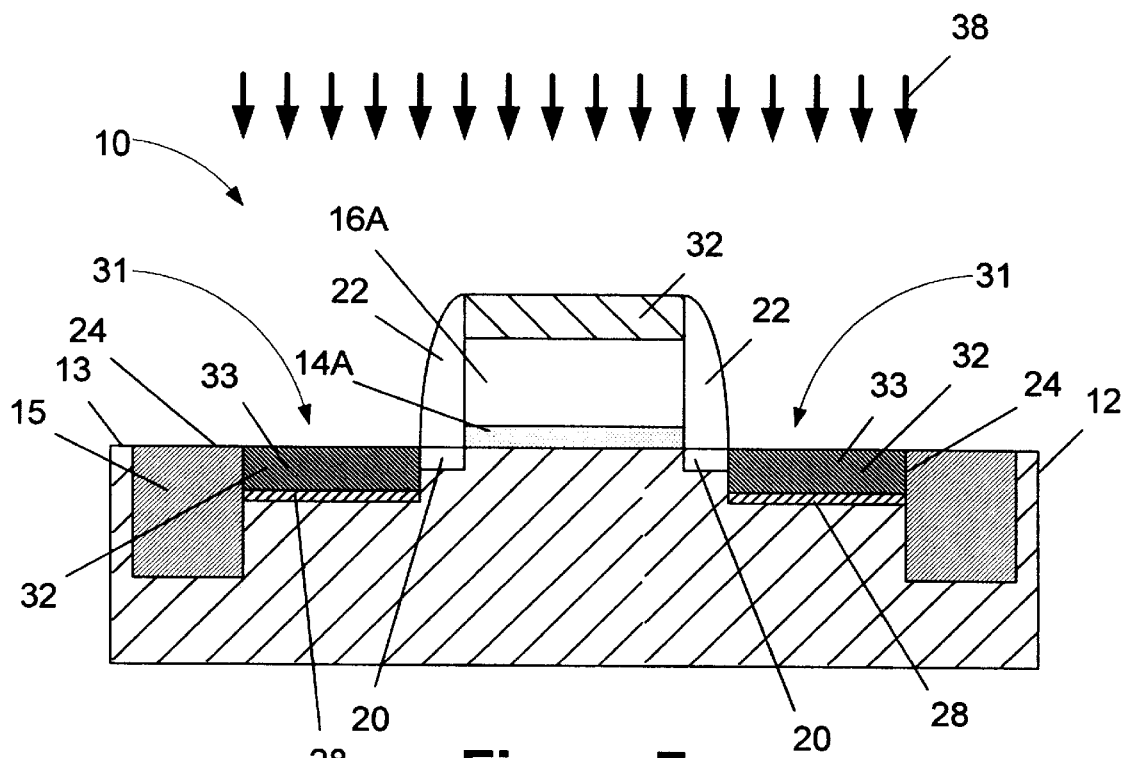
FIG. 7 is a cross-sectional view of the device shown in FIG. 6 after an ion implantation process has been performed on the device.

Next, as shown in FIG. 7, another ion implantation process 38 is performed on the device to form doped regions 33 in at least a portion of the epitaxial silicon regions 32 formed in the recesses 24. Of course, the dopant atoms may not be limited solely to the epitaxial regions 32. As with the other ion implantation processes, the dopant material, concentration, and energy levels of the implantation process may be varied as a matter of design choice. In one illustrative embodiment, the ion implantation process 38 is comprised of approximately $1$–$5\times10^{15}$ ions/cm$^2$ of arsenic, and the energy level may range from approximately 10–30 keV. This results in source/drain regions 31 comprised of doped region 33, doped region 28, and doped region 20, as indicated in FIG. 7. It should be noted that, although an illustrative process flow using free separate ion implantation processes to form source/drain regions comprised of three doped regions has been described herein, the present invention may be used in process flows involving few ion implantation steps and/or fewer doped regions.

Thereafter, a heat treatment or anneal process is performed to activate the dopant atoms in the various doped regions 20, 28 and 33, and to repair any damage to the silicon lattice structure due to the various ion implantation processes describe above. After this anneal process is performed, the dopant atoms in the doped regions 20, 28 and 33 will be driven or moved. This resulting structure is approximately illustrated FIG. 8. For example, the anneal process results in some of the remaining portion of the doped region 20 being driven slightly under the sides 23 of the gate stack 17. Additionally, a portion of the doped region 33 may be driven under the sidewall spacers 22. This heat treatment may be performed by a variety of techniques, e.g., a rapid thermal anneal process, etc. In one illustrative embodiment, the heat treatment is comprised of performing a rapid thermal anneal ("RTA") process at a temperature ranging from approximately 900–1200° C. for a duration ranging from approximately 10–30 seconds. Of course, multiple anneal steps may be performed at various stages of the fabrication process in lieu of performing the single RTA process described above.

Figure 8:
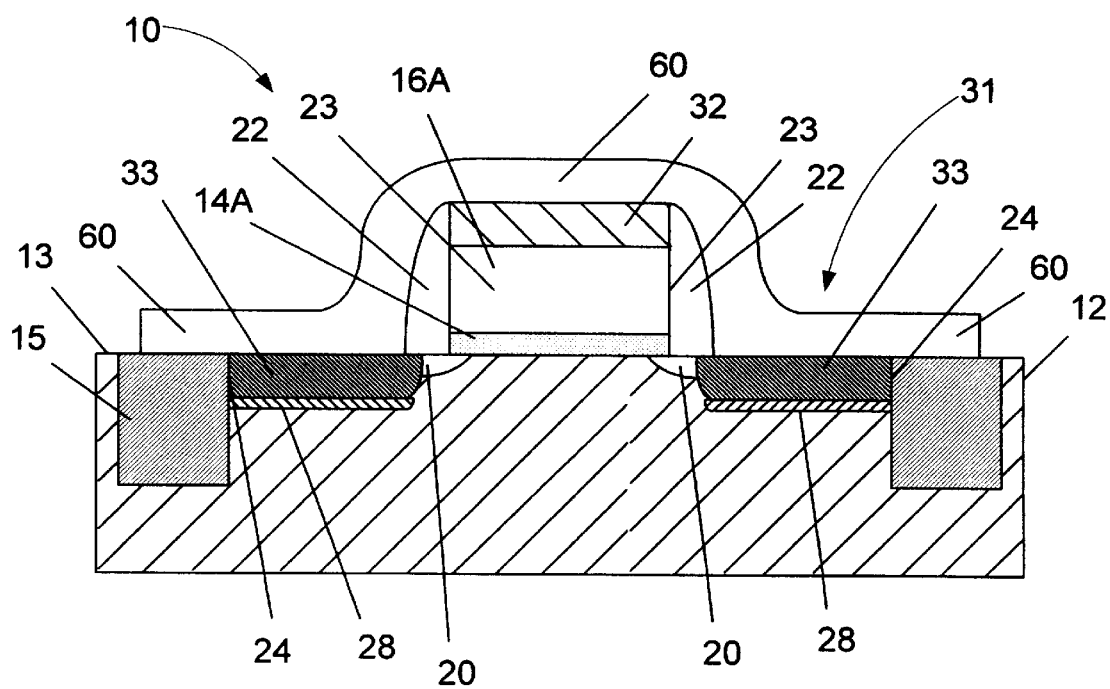
FIG. 8 is a cross-sectional view of the device shown in FIG. 7 after a layer of refractory metal has been formed thereabove.
Figure 9:
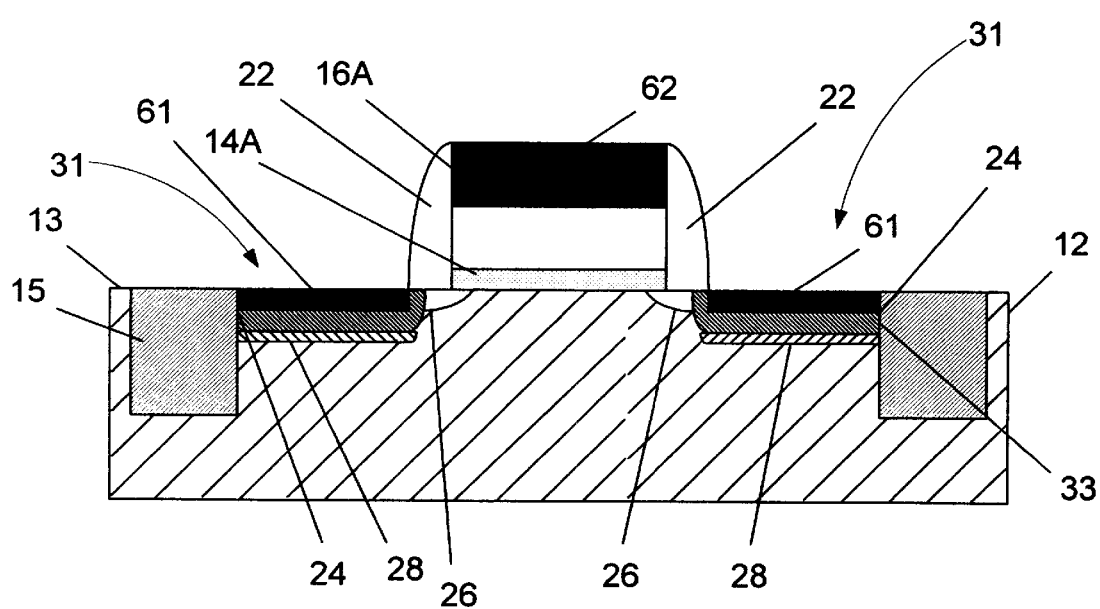
FIG. 9 is a cross-sectional view of the device shown in FIG. 8 after portions of the refractory metal layer have been converted to metal silicide regions.

Next, as shown in FIGS. 8 and 9, traditional salicidation processing is performed to form metal silicide regions above the device depicted in FIG. 7. More particularly, as shown in FIG. 8, a layer of refractory metal 60 is formed above the device. The refractory metal layer 60 may be comprised of a variety of refractory metals, such as cobalt, titanium, etc., and it may be formed by a variety of techniques, e.g. deposition. In one illustrative embodiment, the refractory metal layer 60 is comprised of approximately 100 Å of cobalt that is formed by a deposition process. Thereafter, using traditional salicidation processing, portions of the refractory metal layer 60 are converted to metal silicide regions 61 formed on the source/drain regions 31 and a metal silicide region 62 formed on the gate electrode 16A. The metal silicide regions 61, 62 provide better electrical contact to the source/drain regions 33 and gate electrode 16A.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other tan as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming source/drain regions in a semiconductor device, comprising:

forming a gate stack above a surface of a semiconducting substrate, said gate stack having a plurality of sidewalls;

forming a recess in said substrate adjacent said gate stack, said recess having a bottom surface;

performing a first ion implantation process into the bottom surface of said recess to form a first doped region;

forming a layer of epitaxial silicon in said recess;

performing a second ion implantation process to form a second doped region in at least a portion of said epitaxial silicon formed in said recess; and annealing said first and second doped regions.

2. The method of claim 1, further comprising forming at least one sidewall spacer adjacent said sidewalls of said gate stack.

3. The method of claim 1, further comprising forming a third doped region in said substrate prior to forming said recess in said substrate, a portion of said third doped region being removed by the formation of said recess.

4. The method of claim 1, wherein forming a gate stack above a surface of a semiconducting substrate comprises forming a gate stack comprised of a patterned layer of polysilicon above a semiconducting substrate, said gate stack having a plurality of sidewalls.

5. The method of claim 3, wherein forming a third doped region in said substrate prior to forming said recess in said substrate comprises performing a third ion implantation process at a dopant concentration ranging from approximately $0.1$–$1.0\times10^{15}$ ions/cm$^2$ and at an energy level ranging from approximately 1–10 keV to form a third doped region in said substrate prior to forming said recess in said substrate.

6. The method of claim 2, wherein forming at least one sidewall spacer adjacent said sidewalls of said gate stack comprises forming a layer of spacer material above said gate stack and said substrate, and performing at least one anisotropic etching process.

7. The method of claim 1, wherein forming a recess in said substrate adjacent said gate stack, said recess having a bottom surface, comprises etching a recess in said substrate adjacent said gate stack, said recess having a bottom surface.

8. The method of claim 1, wherein performing a first ion implantation process into the bottom surface of said recess to form a first doped region comprises performing a first ion implantation process at a dopant concentration ranging from approximately $0.2$–$2.0\times10^{14}$ ions/cm$^2$ and at an energy level ranging from approximately 5–15 keV into the bottom surface of said recess to form a first doped region.

9. The method of claim 1, wherein forming a layer of epitaxial silicon in said recess comprises depositing a layer of epitaxial silicon in said recess.

10. The method of claim 1, wherein performing a second ion implantation process to form a second doped region in at least a portion of said epitaxial silicon formed in said recess comprises performing a second ion implantation process at a dopant concentration ranging from approximately $1$–$5\times10^{15}$ ions/cm$^2$ and at an energy level ranging from approximately 10–30 keV to form a second doped region in at least a portion of said epitaxial silicon formed in said recess.

11. The method of claim 1, wherein annealing said first and second doped regions comprises performing one rapid thermal anneal process.

12. The method of claim 1, wherein annealing said first and second doped regions comprises performing multiple rapid thermal anneal processes.

13. The method of claim 1, wherein annealing said first and second doped regions comprises performing one rapid thermal anneal process at a temperature ranging from approximately 900–1200° C. for a duration ranging from approximately 10–30 seconds.

14. A method, comprising:
    forming a gate stack above a semiconducting substrate, said gate stack having a plurality of sidewalls;
    performing a first ion implantation process to form a first doped region in said substrate;
    forming at least one sidewall spacer adjacent said sidewalls of said gate stack;
    forming a recess in said substrate adjacent said gate stack, said recess having a bottom surface;
    performing a second ion implantation process into the bottom surface of said recess to form a second doped region;
    forming a layer of epitaxial silicon at least in said recesses;
    performing a third ion implantation process to form a third doped region in at least a portion of said epitaxial silicon formed in said recesses; and
    annealing said first, second and third doped regions.

15. The method of claim 14, wherein forming a gate stack above a semiconducting substrate, said gate stack having a plurality of sidewalls, comprises forming a gate stack comprised of a patterned layer of polysilicon above a semiconducting substrate, said gate stack having a plurality of sidewalls.

16. The method of claim 14, wherein performing a first ion implantation process to form a first doped region in said substrate comprises performing a first ion implantation process at a dopant concentration ranging from approximately $0.1–1.0 \times 10^{15}$ ions/cm$^2$ and at an energy level ranging from approximately 1–10 keV to form a first doped region in said substrate.

17. The method of claim 14, wherein forming at least one sidewall spacer adjacent said sidewalls of said gate stack comprises forming a layer of spacer material above said gate stack and said substrate, and performing at least one anisotropic etching process.

18. The method of claim 14, wherein forming a recess in said substrate adjacent said gate stack, said recess having a bottom surface, comprises etching a recess in said substrate adjacent said gate stack, said recess having a bottom surface.

19. The method of claim 14, wherein performing a second ion implantation process into the bottom surface of said recess to form a second doped region comprises performing a second ion implantation process at a dopant concentration ranging from approximately $0.2–2.0 \times 10^{14}$ ions/cm$^2$ and at an energy level ranging from approximately 5–15 keV into the bottom surface of said recess to form a second doped region.

20. The method of claim 14, wherein forming a layer of epitaxial silicon at least in said recesses comprises depositing a layer of epitaxial silicon at least in said recesses.

21. The method of claim 14, wherein performing a third ion implantation process to form a third doped region in at least a portion of said epitaxial silicon formed in said recesses comprises performing a third ion implantation process at a dopant concentration ranging from approximately $1–5 \times 10^{15}$ ions/cm$^2$ and at an energy level ranging from approximately 10–30 keV to form a third doped region in at least a portion of said epitaxial silicon formed in said recesses.

22. The method of claim 14, wherein annealing said first, second and third doped regions comprises performing one rapid thermal anneal process.

23. The method of claim 14, wherein annealing said first, second and third doped regions comprises performing multiple rapid thermal anneal processes.

24. The method of claim 14, wherein annealing said first, second and third doped regions comprises performing one rapid thermal anneal process at a temperature ranging from approximately 900–1200° C. for a duration ranging from approximately 10–30 seconds.

25. A method, comprising:
    forming a gate stack above a semiconducting substrate, said gate stack having a plurality of sidewalls;
    performing a first ion implantation process at a dopant concentration ranging from approximately $0.1–1.0 \times 10^{15}$ ions/cm$^2$ and at an energy level ranging from approximately 1–10 keV to form a first doped region in said substrate;
    forming at least one sidewall spacer adjacent said sidewalls of said gate stack;
    etching a recess m said substrate adjacent said sidewall spacer, said recess having a bottom surface;
    performing a second ion implantation process at a dopant concentration ranging from approximately $0.2–2.0 \times 10^{14}$ ions/cm$^2$ and at an energy level ranging from approximately 5–15 keV into the bottom surface of said recess to form a second doped region;
    depositing a layer of epitaxial silicon at least in said recesses;
    performing a third ion implantation process at a dopant concentration ranging from approximately $1–5 \times 10^{15}$ ions/cm$^2$ and at an energy level ranging from approximately 10–30 keV to form a third doped region in at least a portion of said epitaxial silicon formed in said recesses; and
    annealing said first, second and third doped regions.

26. The method of claim 25, wherein forming a gate stack above a semiconducting substrate, said gate stack having a plurality of sidewalls, comprises forming a gate stack comprised of a patterned layer of polysilicon above a semiconducting substrate, said gate stack having a plurality of sidewalls.

27. The method of claim 25, wherein forming at least one sidewall spacer adjacent said sidewalls of said gate stack comprises forming a layer of spacer material above said gate stack and said substrate, and performing at least one anisotropic etching process.

28. The method of claim 25, wherein annealing said first, second and third doped regions comprises performing one rapid thermal anneal process.

29. The method of claim 25, wherein annealing said first, second and third doped regions comprises performing multiple rapid thermal anneal processes.

30. The method of claim 25, wherein annealing said first, second and third doped regions comprises performing one rapid thermal anneal process at a temperature ranging from approximately 900–1200° C. for a duration ranging from approximately 10–30 seconds.

* * * * *